United States Patent
Palit (10) Patent No.: US 12,424,978 B2
(45) Date of Patent: Sep. 23, 2025

(54) DEVICES AND METHODS TO CONTROL DYNAMIC AUDIO RANGE IN NON-BOOSTED AUDIO SYSTEMS

(71) Applicant: TEXAS INSTRUMENTS INCORPORATED, Dallas, TX (US)

(72) Inventor: Supriyo Palit, Bangalore (IN)

(73) Assignee: TEXAS INSTRUMENTS INCORPORATED, Dallas, TX (US)

(\*) Notice: Subject to any disclaimer, the term of this patent is extended or adjusted under 35 U.S.C. 154(b) by 377 days.

(21) Appl. No.: 17/859,304

(22) Filed: Jul. 7, 2022

(65) Prior Publication Data
US 2024/0014781 A1    Jan. 11, 2024

(51) Int. Cl.
*H03F 1/02* (2006.01)
*H03F 3/181* (2006.01)

(52) U.S. Cl.
CPC .................. *H03F 1/0233* (2013.01)

(58) Field of Classification Search
CPC ...... H03F 1/0233; H03F 1/30; H03F 2200/03; H03F 2200/211; H03F 3/181; H03G 7/002; H03G 11/00; H03G 3/3005; H03H 17/02
USPC ................................ 330/108, 302
See application file for complete search history.

(56) References Cited

U.S. PATENT DOCUMENTS

| 8,995,673 B2\* | 3/2015 | Mihelich | H04R 3/002 381/59 |
| 2023/0344388 A1\* | 10/2023 | Demirci | H03F 3/181 |

\* cited by examiner

*Primary Examiner* — Hieu P Nguyen
(74) *Attorney, Agent, or Firm* — Mandy Barsilai Fernandez; Frank D. Cimino (57) ABSTRACT

An audio system includes an amplifier, regulating circuitry, and a filter. The regulating circuitry generates an audio voltage threshold signal based on an estimated value of the supply voltage source of the system, the estimated ESR between the system voltage supply and amplifier voltage supply pin, and the measured output resistance of the system. From these measurements/estimates, an anti-clipping voltage limit signal is generated. Power-budget-based and current-budget-based voltage limit signals are also determined based on first and second functions of the estimated value of the voltage source, respectively. The minimum of these three voltage limit signals is selected as the audio voltage threshold signal. The measurements, estimates and calculations are performed on a periodic basis to continually update the audio voltage threshold signal and thus adaptively regulate the audio system. A de-emphasis filter in the audio signal path compensates for capacitive ripple of the voltage at the amplifier's voltage supply pin.

21 Claims, 5 Drawing Sheets

DEVICES AND METHODS TO CONTROL DYNAMIC AUDIO RANGE IN NON-BOOSTED AUDIO SYSTEMS

FIELD OF DISCLOSURE

This disclosure relates generally to systems, circuits and methods that control and improve dynamic audio range in non-boosted audio systems, and more particularly that enable full use of available audio range while limiting clipping and that enable battery current regulation and preserve battery life.

BACKGROUND

A non-boosted audio playback system provides an amplified output voltage to drive speakers. The voltage rail for the amplified output is directly provided by the power supply, e.g., battery, of the system. The battery voltage at the amplifier supply voltage terminal typically suffers from ripple due to internal battery resistance and external parasitic resistance (a combination of which is known as external series resistance or ESR), and capacitive decoupling. Ripple also depends on the instantaneous current drawn from the battery to power the load. If the current drawn from the battery is too high, then the ripple tends to cause the battery voltage at the amplifier supply voltage terminal to drop significantly, resulting in the amplifier voltage rail being less than the load voltage. This results in clipping. If the current drawn from the battery is too low, then the ripple too will be low, which results in the amplifier voltage rail being greater than the load voltage. This means that headroom (upper portion of the audio range) is available and that target output power could have been further increased. The resulting effect is reduced output loudness. Thus, regulating the load voltage is an important consideration in audio systems. It is also important to regulate battery current and/or battery power.

A conventional approach uses sensing to measure the voltage at the amplifier supply voltage terminal, and use a heavily filtered version of such voltage to limit the load voltage. The effect of ripple is not considered. A filtered supply signal, however, would only consider the DC drop due to ripple; instantaneous AC drop would not be addressed. Even adding a margin to account for AC ripple would not solve the problem, since the AC ripple depends on resistance which depends on ambient conditions such as temperature. Also, a decoupling capacitor at the output of the battery causes the ripple to be frequency dependent. Thus, such conventional approach fails to accurately compensate for the ripple, inevitably either over compensating (resulting in lower loudness) or under compensating (resulting in clipping and brown-out). Also, such approach does not provide controls to regulate battery current/power; thus, battery life is compromised.

A better solution to these issues is thus desirable.

SUMMARY

In an example, voltage regulating circuitry comprises a voltage limiter, a filter, and a selector. The voltage limiter has a filtered audio input, an audio voltage threshold input, and a gain signal output. The filter, which may be a de-emphasis filter, has an audio input and an audio output coupled to the filtered audio input. The selector has an anti-clipping voltage limit input at which an anti-clipping voltage limit signal (e.g., $PVDD_{Lim}$) is received, a power-based voltage limit input at which a power-based voltage limit signal is received, a current-based voltage limit input at which a current-based voltage limit signal is received, and an output coupled to the audio voltage threshold input. The selector is configured to select one of the anti-clipping voltage limit signal, the power-based voltage limit signal and the current-based voltage limit signal, and output the selected signal as an audio voltage threshold signal (e.g., $V_{Lim}$) to the audio voltage threshold input of the voltage limiter.

In an example, an audio system comprises an amplifier and regulating circuitry. The amplifier has an audio input, a supply voltage input and a voltage output adapted to be coupled to a load. The regulating circuitry is configured to: determine a present value of a source voltage (e.g., PVDD) and generate a measured voltage signal representing the estimated present value of the voltage source (e.g., $PVDD_{Msr}(n)$) based on a maximum input voltage value (e.g., $PVDD_{Max}$) of a voltage at the supply voltage input of the amplifier (e.g., $PVDD_{Dev}$), an average input voltage value (e.g., $PVDD_{Avg}$) of the voltage at the supply voltage input of the amplifier and a silence voltage threshold; set a present value of an estimate of external series resistance (ESR) between the voltage source and the supply voltage input of the amplifier, the present value of ESR (e.g., $ESR(n)$) based on a minimum input voltage value (e.g., $PVDD_{Min}$) of the voltage at the supply voltage input of the amplifier, a previous value of the estimate of ESR (e.g., $ESR(n-1)$) and whether audio of the audio system is under compression; determine an anti-clipping voltage limit signal (e.g., $PVDD_{Lim}$) based on the estimated present value of the voltage source, the present value of the ESR and a measured resistance value indicative of a present resistance of the load; calculate a power-based voltage limit signal based on a first function (e.g., $f1$) of the estimated present value of the voltage source; and calculate a current-based voltage limit signal based on a second function (e.g., $f2$) of the estimated present value of the voltage source.

In an example, a method comprises measuring a source voltage applied to an audio system to generate a measured source voltage signal; updating an estimate of external series resistance (ESR) between a voltage source and a supply voltage input of an amplifier of the audio system to generate an updated estimate of ESR; measuring a resistance of a load of the audio system to generate a measured resistance; generating an anti-clipping voltage limit signal based on the measured source voltage signal, the updated estimated ESR, and the measured resistance; calculating a power-based voltage limit signal based on the measured source voltage signal; calculating a current-based voltage limit signal based on the measured source voltage signal; and selecting one of the anti-clipping voltage limit signal, the power-based voltage limit signal, and the current-based voltage limit signal as an audio voltage threshold signal for the audio system.

These and other features will be better understood from the following detailed description with reference to the accompanying drawings.

BRIEF DESCRIPTION OF THE DRAWINGS

Features of the disclosure may be understood from the following figures taken in conjunction with the detailed description.

The same reference numbers are used in the drawings to designate the same or similar (structurally and/or functionally) features.

DETAILED DESCRIPTION

Specific examples are described below in detail with reference to the accompanying figures. These examples are not intended to be limiting. The objects depicted in the drawings are not necessarily drawn to scale.

In aspects of the disclosure, load voltage is regulated to increase or maximize audio headroom/loudness while preventing or minimizing clipping in non-boosted audio systems. That is, the target load voltage is regulated to be approximately equal to the instantaneous amplifier voltage rail. In aspects of the disclosure, battery current and/or battery power is regulated to prevent excessive discharge of the voltage source (e.g., battery) that may result from driving a high load voltage for an extended duration. Performing power/current regulation not only preserves battery life but also minimizes the chance of the audio system experiencing brown-out.

Load voltage is regulated based on an estimate or measurement of true battery voltage ($PVDD_{Msr}$) under a low ripple/silence condition, an estimate of ESR and measurement of the load resistance (Re). $PVDD_{Msr}$ and the ESR estimate are obtained from sampling and processing the voltage at the amplifier supply voltage input terminal ($PVDD_{Dev}$). The ESR estimate updates a previous ESR estimate, considering the instantaneous ripple on $PVDD_{Dev}$. ESR estimate may be increased when $PVDD_{Dev}$ falls below $PVDD_{Lim}$, which would then decrease $PVDD_{Lim}$. ESR estimate may be decreased at a very slow rate to recover headroom due to a change in system conditions, which would cause PVDD Lim to increase. ESR estimate may be reset to an initial or default value when there is a prolonged period of silence.

$PVDD_{Msr}$ and the estimated ESR are then used to determine an anti-clipping voltage limit signal ($PVDD_{Lim}$). $PVDD_{Lim}$ is compared with other voltage limit signals that are generated based on power and current budgets, PLIM and ILIM, respectively. PLIM and ILIM are obtained by applying respective functions to $PVDD_{Msr}$, and then PLIM and ILIM are further processed to generate power-budget-based and current-budget-based voltage limit signals, respectively. That is, an audio voltage threshold signal ($V_{Lim}$), used to control audio, is selected from among $PVDD_{Lim}$, the power-budget-based voltage limit signal, and the current-budget-based voltage limit signal. Preferably, the minimum of those three signals is selected as $V_{Lim}$. A de-emphasis filter in the audio control path is used to compensate for frequency-dependent $PVDD_{Dev}$ ripple.

Advantageously, $V_{Lim}$ dynamically adapts to changes in system conditions by tracking PVDD, ESR and Re, while the de-emphasis filter compensates for frequency-dependent capacitive ripple. This ensures that the load voltage for audio playback will be (i) below the clipping threshold and (ii) nearly equal to the target output load power. This maximizes sound pressure level (SPL) and minimizes clipping. Considering PLIM and ILIM in determining Vu m improves or optimizes battery life and ensures balanced audio. Moreover, the system may be configured such that the audio limiter engages only when the signal level is large. Hence, comparatively softer sections of audio are not compressed even when the battery voltage is low, thus optimizing loudness and dynamic range even during low battery condition.

Figure 1:
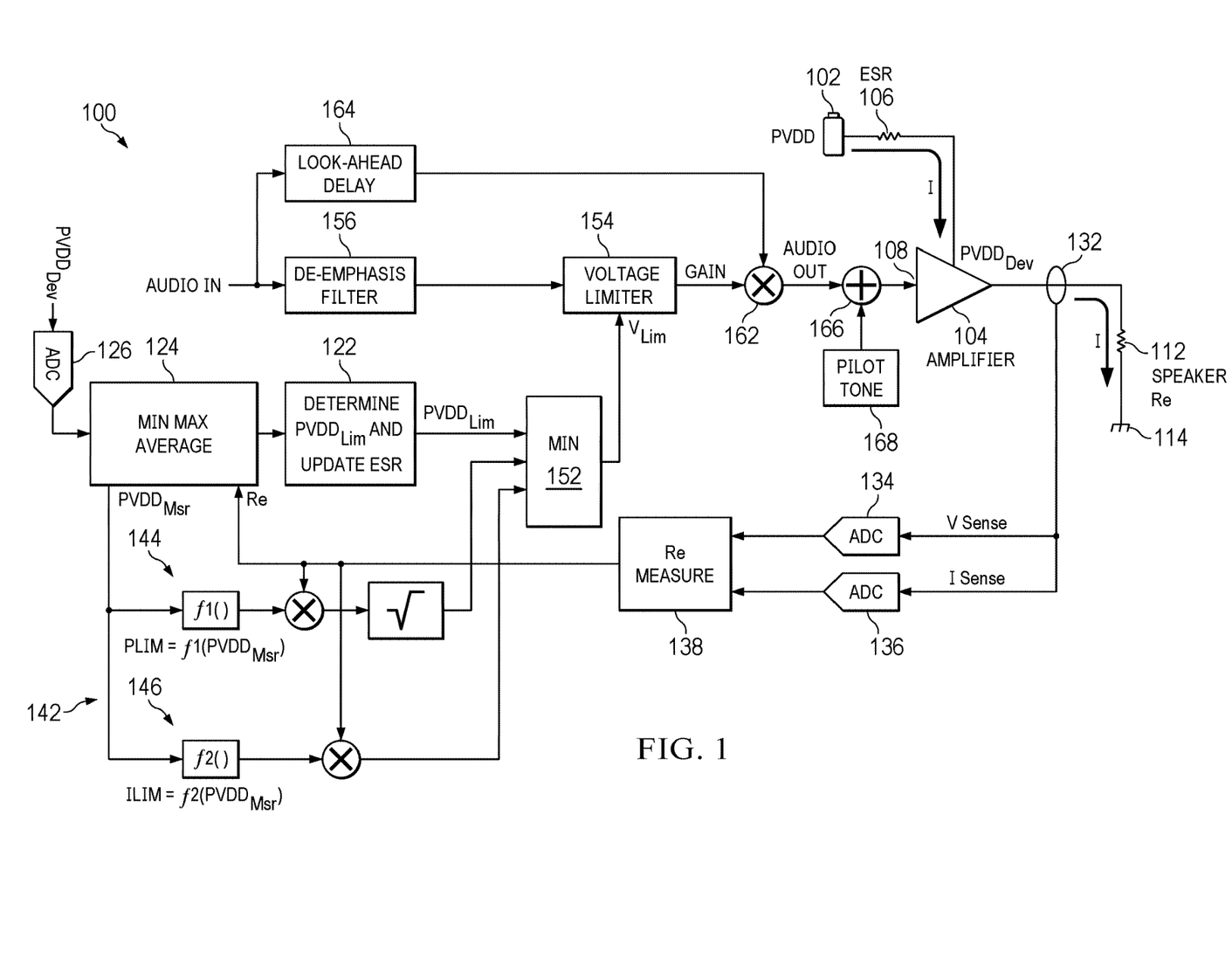
FIG. 1 is a schematic diagram of components of an example non-boosted audio system.

FIG. 1 illustrates an example audio system 100 that includes a voltage source (e.g., a battery) 102, the true voltage of which is denoted PVDD. Battery 102 is coupled to a voltage input of an amplifier 104 via ESR 106. The voltage at the amplifier supply voltage input is denoted by $PVDD_{Dev}$. Amplifier 104 has an audio input 108 at which an audio signal is received. A load 112 (having resistance Re) is coupled between an output of amplifier 104 and ground 114. Load 112 may be a speaker, for example.

In general, an algorithm implemented by audio system 100 measures PVDD to generate a measured voltage signal (PVDD Msr) representing an estimated value of the voltage of battery 102, estimates ESR, measures the resistance (Re) of the load, and regulates audio such that $PVDD_{Lim}$, which represents an anti-clipping voltage limit of audio system 100, is less than $PVDD_{Dev}$. $PVDD_{Lim}$ across load 112 draws a current (I) that is approximately equal to $PVDD_{Lim}$/Re. The voltage drop across ESR 106 can be determined as: $ESR*(PVDD_{Lim}/Re)$, and $PVDD_{Dev}$ is approximately equal to $PVDD - ESR*(PVDD_{Lim}/Re)$. To prevent clipping, $PVDD_{Lim} \leq PVDD_{Dev} - ESR*(PVDD_{Lim}/Re)$. Hence, $PVDD_{Lim} \leq PVDD_{Msr}/[1+ESR/Re]$. To maximize audio output: $PVDD_{Lim} = PVDD_{Msr}/[1+ESR/Re]$.

Audio system 100 includes a controller 122 to determine $PVDD_{Lim}$. Controller 122 is coupled to the output of a sampler 124, the input of which is coupled to an analog-to-digital converter (ADC) 126. ADC 126 receives $PVDD_{Dev}$, which is the analog supply voltage signal input to the amplifier 104, and samples $PVDD_{Dev}$. The sampling interval may be any suitable time period, e.g., 10.4 μs (corresponding to a sampling rate of 96 KHz). This is a typical sampling rate with which ADC 126 digitizes $PVDD_{Dev}$, although other sampling rates may be used.

The sampled and digitized values are then processed by controller 122 to generate an estimated present value of the voltage of battery 102, which present value is denoted by $PVDD_{Msr}(n)$ and an estimated present resistance value of ESR 106, which present value is denoted by ESR(n). $PVDD_{Msr}(n)$ and ESR(n) are, in turn, used by controller 122, along with a measured resistance (Re) of load 112, to calculate an anti-clipping voltage limit $PVDD_{Lim}$, as described in more detail below in connection with FIG. 2.

To measure resistance (Re) of load 112, and thus obtain Re for the calculation of $PVDD_{Lim}$, audio system 100 further includes voltage and current sensing circuitry 132 to sense the output voltage across load 112 and output current flowing through load 112 at each calculation interval. Circuitry 132 generates an analog signal indicative of the sensed output voltage (V sense), which signal is input to ADC 134 and digitized. Circuitry 132 also generates an analog signal indicative of the sensed output current (I sense), which signal is input to ADC 136 and digitized. The digital voltage and current values are then output by ADCs 134 and 136, respectively, to a resistance measurement circuit 138, where the load resistance value (Re) is determined. In an example, the output voltage and current are sensed periodically to provide an updated load resistance value (Re(n)) each calculation period, which values are provided by resistance measurement circuit 138 to controller 122 and other components described below as the values are obtained. Further detail regarding Re(n) measurement is given below.

Audio system 100 further includes calculating circuitry 142 to calculate a current-budget-based voltage limit signal and a power-budget-based voltage limit signal. Calculating circuitry 142 may include a first calculator 144 that includes a function block that receives $PVDD_{Msr}$ from controller 122, applies a first function ($f1$) to $PVDD_{Msr}$ to generate a system power budget (PLIM). PLIM is input to a multiplier of first calculator 144, where PLIM is multiplied with the load resistance value (Re) obtained from resistance measurement circuit 138. First calculator 144 also includes a square root function block to compute $\sqrt{PLIM*Re}$ to generate a corresponding power-budget-based voltage limit signal. Calculating circuitry 142 further includes a function block and multiplier block to first apply a second function ($f2$) to $PVDD_{Msr}$ to generate a system current budget (ILIM), which is then multiplied with Re obtained from resistance measurement circuit 138 to generate a corresponding current-budget-based voltage limit signal. The first function ($f1$) may be configured such that as PVDD decreases, PLIM can be decreased to preserve battery life. The second function ($f2$) may be similarly configured in terms of functionality; that is, $f2$ may operate on $PVDD_{Msr}$ such that as PVDD decreases so does ILIM, which also acts to preserve battery life.

Each of the anti-clipping voltage limit signal ($PVDD_{Lim}$), the power-budget-based voltage limit signal and the current-budget-based voltage limit signal is supplied to a selector 152, which is configured to select the minimum of these three signals, and output the selected minimum signal as an audio voltage threshold signal ($V_{Lim}$) to a voltage limiter 154.

In addition to having an audio voltage threshold input for $V_{Lim}$, voltage limiter 154 also has a filtered audio input coupled to an output of a filter (e.g., a de-emphasis filter) 156, which has an audio input to receive an audio signal (Audio In). Voltage limiter 154 is configured to output a gain signal (Gain) to a multiplier 162 that also receives a signal from a look-ahead delay 164. Look-ahead delay 164 receives Audio In and is configured to delay the audio signal, as needed, to compensate for slow gain. In an example, delay may be 128 samples corresponding to a look ahead delay of 2.7 µs for an audio sampling rate of 48 KHz.

Multiplier 162 multiplies the output of look-ahead delay 164 with the gain signal from voltage limiter 154 to generate an audio signal (Audio Out) that is input to an adder 166, which also receives a pilot tone 168. Adder 166 adds pilot tone 168, which may be in the form of a very low amplitude and very low frequency signal, to Audio Out from multiplier 162 to generate an audio signal for input to amplifier 104. At very low frequency, load (i.e., speaker) 112 is resistive. Very low amplitude keeps the power loss due to pilot tone 168 to a minimum.

Pilot tone 168 is also considered in the Re(n) measurement. In an example, the sensed V/I signals from voltage and current sensing circuitry 132 are passed through band-pass filters, which may be implemented in a digital signal processor (not shown) of audio system 100, tuned to the pilot tone frequency. The filtered signals are then passed through a digital divider block (voltage/current) of resistance measurement circuit 138 to compute Re(n), e.g., $$Re(n) = \frac{V(\text{Pilot Frequency})}{I(\text{Pilot Frequency})}.$$

In another example, the divider output is passed through an averaging filter of resistance measurement circuit 138 to filter out noise on the sensed resistance signal. Thus, in the latter example, $$Re(n) = \text{Filter}\left[\frac{V(\text{Pilot Frequency})}{I(\text{Pilot Frequency})}\right].$$

Figure 2:
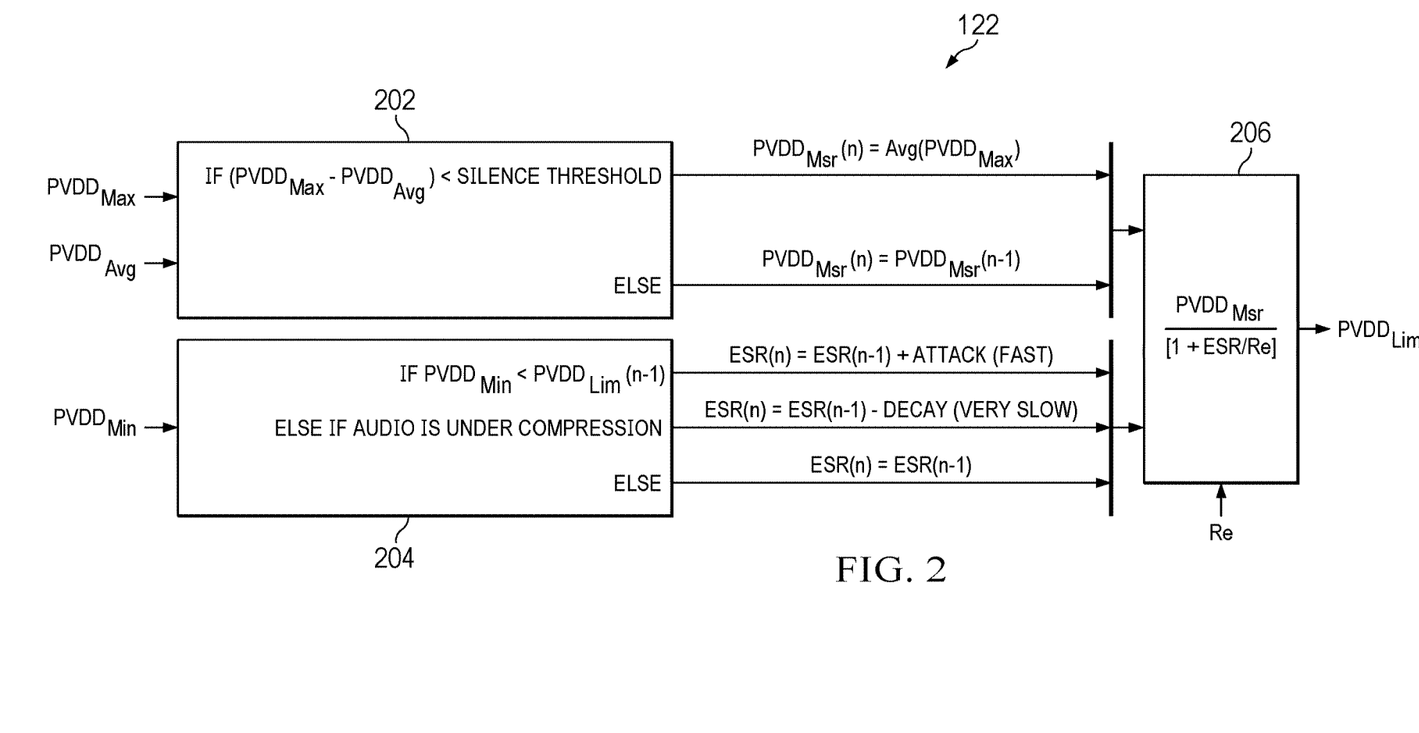
FIG. 2 is a schematic diagram of an example controller including an example source voltage measurer and an example external series resistance (ESR) estimator, which may be employed in the example non-boosted audio system of FIG. 1.

FIG. 2 is a schematic diagram of example controller 122 including an example source voltage measurer 202, an example external series resistance (ESR) estimator 204, and an example $PVDD_{Lim}$ calculator 206. In each calculation interval n, source voltage measurer 202 determines $PVDD_{Msr}(n)$, ESR estimator 204 determines ESR(n), which values are then used by calculator 206, along with resistance measurement Re(n), to determine $PVDD_{Lim}(n)$.

In an example, source voltage measurer 202 measures PVDD via $PVDD_{Dev}$, for a block of samples (where N is the block size) to generate temporary maximum, average and minimum input voltage values: $MAX_V$, $AVG_V$, and $MIN_V$, respectively. In an example, $MAX_V$, $AVG_V$ and $MIN_V$ are determined as follows: $MAX_V = \max(PVDD_{Dev}(n))|_{n=0,1,\ldots,N-1}$; $AVG_V = \text{avg}(PVDD_{Dev}(n))|_{n=0,1,\ldots,N-1}$; and $MIN_V = \min(PVDD_{Dev}(n))|_{n=0,1,\ldots,N-1}$; If $MAX_V \cong AVG_V$, i.e., the difference between $MAX_V$ and $AVG_V$ is less than a silence voltage threshold, which may be approximately 10 mV, then $$PVDD_{Msr} = \frac{\sum_{k=0}^{K-1} MAX_V(i)}{K},$$

where K is the number of averaging blocks. That is, $PVDD_{Msr}(n) = \text{Avg}(PVDD_{Max})$. Otherwise, $PVDD_{Msr}$ remains the same as the previous source voltage measurement; that is, $PVDD_{Msr}(n) = PVDD_{Msr}(n-1)$.

$MAX_V$ only under low audio conditions is considered in measuring PVDD, as ripple is negligible during low audio segments. One or more de-coupling capacitors coupled to the output of battery 102 may reduce ripple at high frequencies for large signal audio.

In an example, ESR estimator 204 updates an estimate of ESR 106, denoted by ESR(n), by adapting to changing audio and external conditions. If $MIN_V < PVDD_{Lim}(n-1)$, i.e., the previous calculation of $PVDD_{Lim}$, then ESR(n), i.e., the current estimate of ESR, is increased relative to its previous estimate (ESR(n−1)) in a fast attack manner; that is, ESR(n)=ESR(n−1)+an attack amount of resistance, which may be 0.05Ω. This ensures that $PVDD_{Lim}$ is regulated to prevent clipping. If $MIN_V \geq PVDD_{Lim}(n-1)+\Delta$ consistently for certain period of time and the audio is compressed, then ESR(n) is reduced in a slow release manner; that is, ESR(n)=ESR(n−1)—a decay amount, which may be 0.01Ω. This ensures that available headroom is recovered when ESR reduces due to change in ambient conditions. In an example, Δ may be approximately 100 mV. If neither of those conditions apply, estimated ESR remains the same; that is, ESR(n)=ESR(n−1). This means that even if ESR has decreased due to change in ambient condition(s) there is already enough audio headroom available so no ESR adaptation is required.

Whether the audio is under compression can be determined by comparing the output audio signal (Audio Out) with the input audio signal (Audio In). If the amplitude of Audio Out is less than the amplitude of Audio In, the audio is under compression.

In the case in which $MAX_V \cong AVG_V$ for a prolonged period of time, which would include a prolonged period of silence, (e.g., approximately 5 minutes), estimated ESR may be reset to an initial (default) value after that time.

Figure 3:
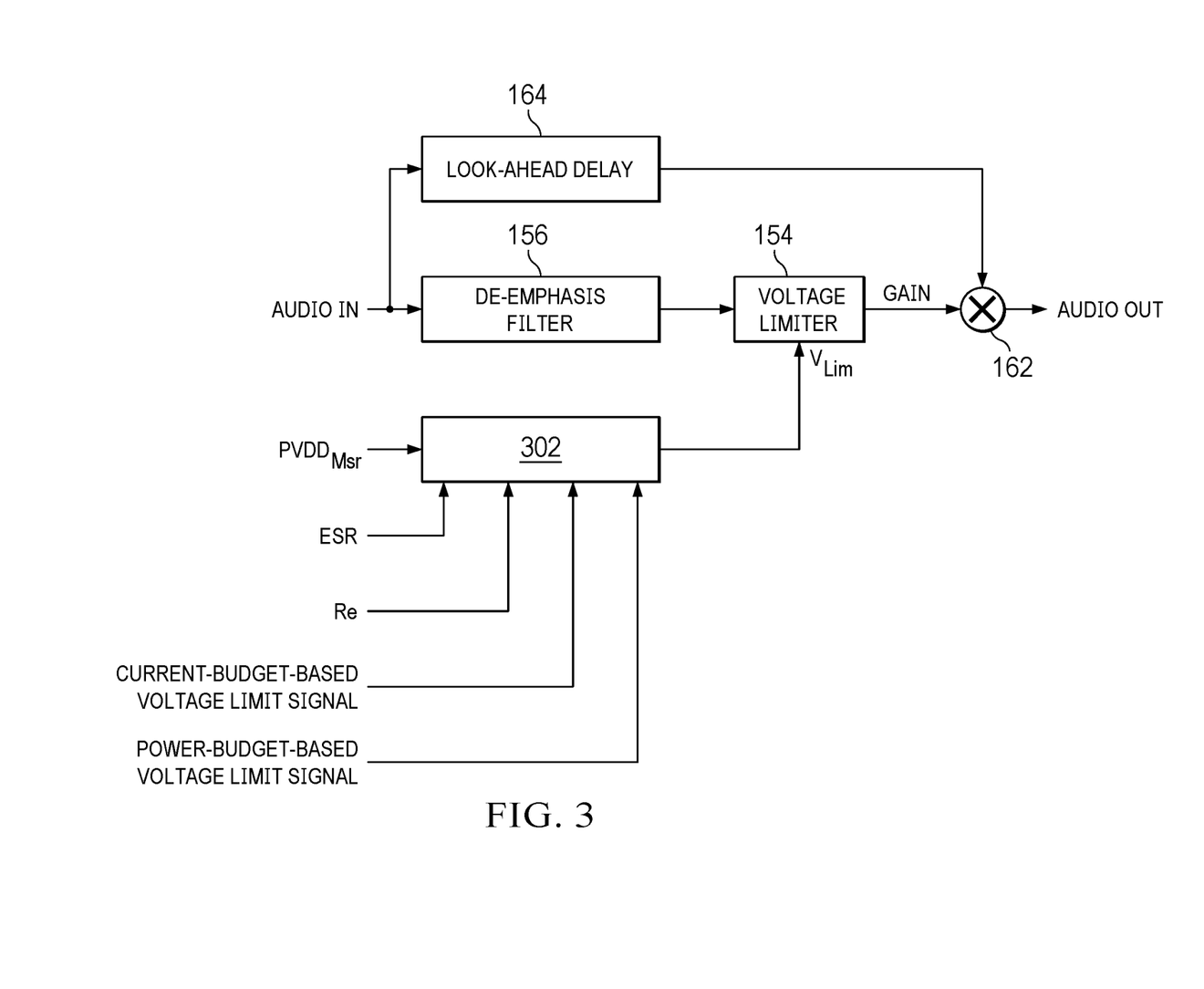
FIG. 3 is a schematic diagram of an example de-emphasis filter and an example voltage limiter in the audio signal path, as well as other associated components of an example non-boosted audio system, such as that of FIG. 1.

FIG. 3 shows the audio signal path including example de-emphasis filter 156, which receives the input audio signal (Audio In) and provides a filtered audio signal to voltage limiter 154, which generates a gain signal (Gain). In FIG. 3, component 302 represents a combination of $PVDD_{Lim}$ calculator 206 and selector 152. Thus, $PVDD_{Lim}$ is calculated by component 302 based on inputs $PVDD_{Msr}$, estimated ESR and measured Re, as described above. Component 302 also receives the power-budget-based and current-budget-based voltage limit signals from calculators 144 and 146, respectively, and selects one of $PVDD_{Lim}$, the power-budget-based voltage limit signal, and the current-budget-based limit signal as $V_{Lim}$, which is output by component 302 and input to voltage limiter 154.

Figure 4:
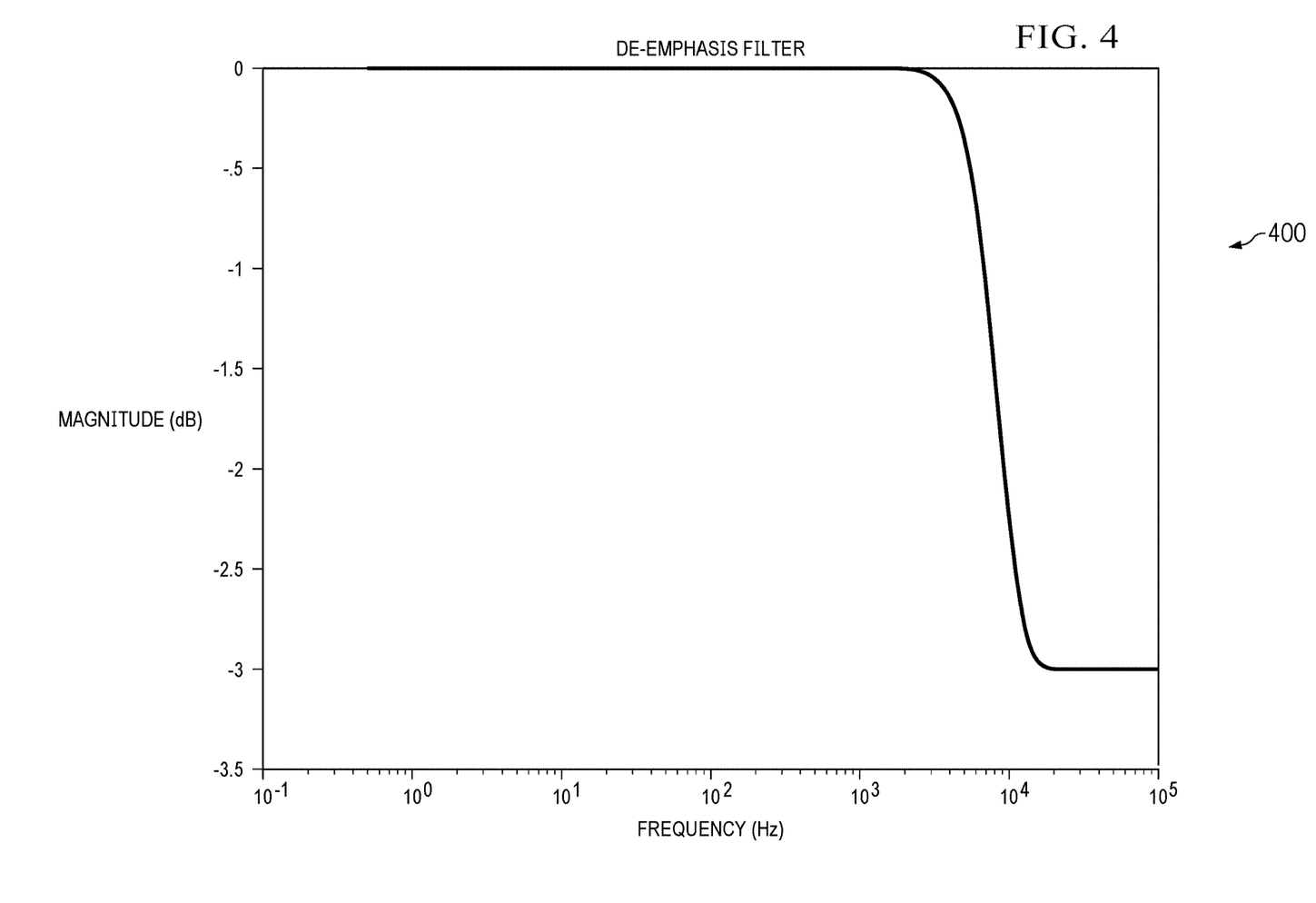
FIG. 4 is a graph of magnitude with respect to frequency of an output of an example de-emphasis filter, such as that of FIG. 3.

De-emphasis filter 156 compensates for frequency-dependent, e.g., capacitive, ripple in the audio signal path, as well as de-emphasizes higher frequency components of the audio signal, as shown in graph 400 of FIG. 4 depicting the magnitude (dB) of the filtered audio signal with respect to its frequency (Hz). De-emphasis filter 156 allows less power to go through voltage limiter 154 at high frequencies, causing it to relax the attenuation and take advantage of increased audio headroom due to low ripple. In an example, de-emphasis filter 156 is tunable based on the decoupling capacitor at the output of battery 102. De-emphasis filter 156 can also be used to compensate for lower power delivery due to reactive load at high frequencies.

Voltage limiter 154 may include peak-tracker circuitry to track the peak and estimate the amplitude of the filtered input signal (In(n)) received from de-emphasis filter 156. The estimate of the amplitude of In(n) is denoted $In_{est}(n)$. To obtain $In_{est}(n)$, the peak-tracker circuitry compares the absolute value of the filtered input signal, i.e., (|In(n)|), with the estimate of the peak in the immediately previous audio calculation interval ($In_{est}(n-1)$). If $In_{est}(n-1) < |In(n)|$, then $In_{est}(n) = |In(n)|$; otherwise (i.e., if $In_{est}(n-1) \geq |In(n)|$, $In_{est}(n) = In_{est}(n-1) \times$ a decay factor. The decay factor may correspond to a decay time constant that allows for a slower release of the gain signal by voltage limiter 154. In an example, the decay factor may be 0.9993 (corresponding to a decay time constant of 30 ms for an audio sampling rate of 48 KHz). To prevent or minimize distortion, voltage limiter 154 may include a smoothing filter through which $In_{est}(n)$ is passed to generate a signal: $Filter[In_{est}(n)]$, which is a smoothened estimate of the amplitude of In(n).

In an example, de-emphasis filter 156 may be configured to engage only when $PVDD_{Lim}$ is selected as $V_{Lim}$. In all other cases (i.e., when $PVDD_{Lim}$ is not selected as $V_{Lim}$), voltage limiter 154 receives Audio In (the unfiltered audio input signal), and performs the operations described above on Audio In (instead of the filtered audio signal).

Look-ahead delay 164 receives the unfiltered audio signal and delays it to ensure that the slow application of the gain signal due to the smoothing filter does not cause clipping. The audio is delayed by an amount (Delay) to compensate for the slow gain. In an example, Delay may be 128 samples corresponding to a look ahead delay of 2.7 µs for audio sampling rate=48 KHz.

Voltage limiter 154 calculates and outputs a gain signal (e.g., Gain(n)) according to the formula:

$$\text{Gain}(n) = \text{MIN}\left(1, \frac{V_{Lim}(n)}{\text{Filter}[In_{est}(n)]}\right).$$

The audio output of multiplier 162 is: Audio Out(n−Delay)=In(n−Delay)×Gain(n).

Figure 5:
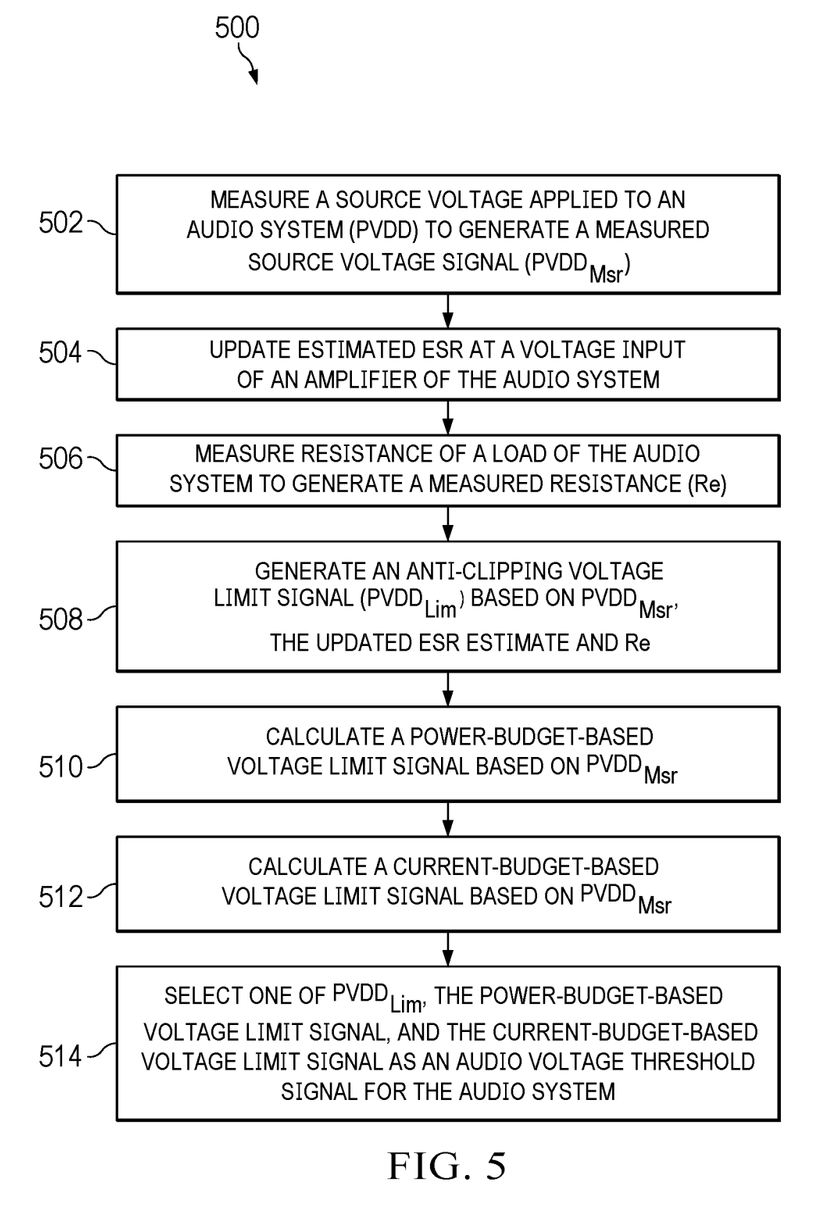
FIG. 5 is a flow diagram of example operation of components of an example non-boosted audio system, such as that of FIG. 1.

FIG. 5 is a flow diagram of an example method 500 of operating an example non-boosted audio system (or components thereof), such as that of FIG. 1. In operation 502, a source voltage (PVDD) applied to an audio system, e.g., audio system 100, is measured to generate a measured source voltage signal ($PVDD_{Msr}$). $PVDD_{Msr}$ may be obtained by sampling a voltage ($PVDD_{Dev}$) at the supply voltage input pin of an amplifier, e.g., amplifier 104 of audio system 100, generating digital values of the samples, and processing the samples to provide maximum, average and minimum values. The maximum and average values are used in determining $PVDD_{Msr}$. In operation 504, estimated ESR, which is an estimate of the resistance between the voltage source output and the supply voltage input pin of the amplifier, is updated relative to previous estimate. Such update is based on the minimum input voltage value. In operation 506, the resistance of the load of the audio system is measured to generate a measured resistance Re. The measured resistance Re may be obtained by sensing the output voltage and output current of the audio system.

In operation 508, an anti-clipping voltage limit signal $PVDD_{Lim}$ is generated based on $PVDD_{Msr}$, the updated ESR estimate and measured Re. $PVDD_{Lim}$ may be calculated every calculation period based on the most recent measurements/estimates of $PVDD_{Msr}$, ESR and Re according to the following formula: $PVDD_{Msr}/[1+ESR/Re]$.

Load voltage regulation further includes calculating a power-budget-based voltage limit signal based on $PVDD_{Msr}$ (operation 510) and calculating a current-budget-based voltage limit signal based on $PVDD_{Msr}$ (operation 512). A power budget PLIM is obtained as a first function of $PVDD_{Msr}$, and a current budget ILIM is obtained as a second function of $PVDD_{Msr}$. PLIM and ILIM are then converted into respective voltage limit signals.

In operation 514, one of $PVDD_{Lim}$, the power-budget-based voltage limit signal, and the current-budget-based voltage limit signal is used as an audio voltage threshold signal for the audio system. In an example, the minimum of those three signals is selected as the audio voltage threshold signal.

FIG. 5 depicts one possible order of operations employed to control an audio system. Not all operations need necessarily be performed in the order described. Some operations may be performed substantially simultaneously or in overlapping time periods. Some operations may be combined into a single operation. Additional operations and/or alternative operations may be performed depending on the particular audio system.

The foregoing describes an intelligent management solution for non-boosted audio systems that improves audio playback quality, i.e., improved loudness and dynamic range across a range of battery levels with no or minimal clipping, as well as improved battery life due to load-based voltage regulation.

In examples, load voltage is regulated using battery voltage sensing, output resistance sensing (via output voltage and current sensing). Battery voltage sensing is based on the voltage at the amplifier supply voltage pin ($PVDD_{Dev}$) to obtain a measurement of battery voltage, i.e., a measured voltage signal ($PVDD_{Msr}$). $PVDD_{Msr}$ is used to determine an anti-clipping voltage limit signal ($PVDD_{Lim}$), as well as power-budget-based and current-budget-based voltage limit signals. The effect of ESR on ripple (slow change) is compensated by an iterative process: estimated ESR is increased whenever $PVDD_{Dev}$ falls below $PVDD_{Lim}$, which decreases $PVDD_{Lim}$, and estimated ESR is decreased at a very slow rate to track changes in ESR to recover headroom due to change in system conditions (which is usually a very slow phenomenon), which increases $PVDD_{Lim}$. In examples, the effect of the decoupling capacitor on ripple (which is usually a fast, frequency dependent phenomenon) is compensated by a de-emphasis filter. As the frequency of the audio input changes, the filter allows frequency dependent power/current regulation to maximize the audio loudness without sacrificing audio quality (i.e., without clipping or distortion).

The term "coupled" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between devices A and B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal" and "pin" are coextensive, and each may indicate a node, interconnection and/or a lead. Unless specifically stated to the contrary, these terms are generally used to mean an interconnection within, or a terminus of, a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or by a third-party.

Circuits described herein are reconfigurable to include the replaced components to provide functionality at least partially similar to functionality available prior to the component replacement. A component shown as a single resistor, unless otherwise stated, is generally representative of any one or more resistors coupled in series and/or parallel to provide an amount of impedance represented by the shown resistor. The same is true for a capacitor of the disclosure. A single capacitor, unless otherwise stated, is generally representative of a capacitive element that may comprise multiple capacitors coupled to provide an amount of capacitance between the two nodes across which the single capacitor is coupled.

Uses of the phrase "ground" in the foregoing description include any form of ground connection applicable to, or suitable for, the particular audio system. Thus, "ground" encompasses, without limitation, a chassis ground, an Earth ground, a floating ground, a virtual ground, a digital ground, a common ground. Unless otherwise stated, "about," "approximately," or "substantially" preceding a value means +/− 10 percent of the stated value.

Modifications of the described examples are possible, as are other examples, within the scope of the claims. For example, while the above description focuses primarily on a single bank voltage limiter for a mono system, the teachings are readily applicable to multi-band limiter architectures and for multi-channel systems.

Features described herein may be applied in other environments and applications consistent with the teachings provided.

What is claimed is:

1. An electronic circuit comprising:
   a voltage limiter having a filtered audio input, an audio voltage threshold input, and a gain signal output;
   a filter having an audio input and an audio output coupled to the filtered audio input;
   a selector having an anti-clipping voltage limit input, a power-based voltage limit input, a current-based voltage limit input, and an output coupled to the audio voltage threshold input, the selector configured to select one of an output of the anti-clipping voltage limit input, an output of the power-based voltage limit input and an output of the current-based voltage limit input, and output the selected output as an audio voltage threshold signal to the audio voltage threshold input of the voltage limiter; and
   a controller having a first voltage input configured to receive a maximum input voltage value of a voltage for input to a supply voltage input of an amplifier associated with the voltage limiter, a second voltage input configured to receive a minimum input voltage value of the voltage for input to the supply voltage input of the amplifier, a third voltage input configured to receive an average input voltage value of the voltage for input to the supply voltage input of the amplifier, a resistance input configured to receive an output resistance value, and an output configured to output an anti-clipping voltage limit signal to the anti-clipping voltage limit input of the selector.

2. The electronic circuit of claim 1, wherein the controller is configured to estimate a present value of a source voltage and generate a measured voltage signal representing the estimated present value of the voltage source based on the maximum input voltage value, the average input voltage value and a silence voltage threshold.

3. The electronic circuit of claim 2, wherein the controller is configured to estimate a present value of external series resistance (ESR) between an output of a voltage source and the supply voltage input of the amplifier and generate a measured resistance value representing the estimated present value of the ESR, the present value of the estimated ESR based on the minimum input voltage value, a previous value of the anti-clipping voltage limit signal, a previous value of the estimated ESR and whether audio of an audio system is under compression.

4. The electronic circuit of claim 3, wherein the controller is configured to determine the anti-clipping voltage limit signal based on the estimated present value of the voltage source, the estimated present value of the ESR and the output resistance value.

5. The electronic circuit of claim 4, further comprising:
a first calculator configured to calculate a power-based voltage limit signal based on a first function of the estimated present value of the voltage source; and
a second calculator configured to calculate a current-based voltage limit signal based on a second function of the estimated present value of the voltage source.

6. The electronic circuit of claim 5, wherein the selector is configured to select a minimum of the anti-clipping voltage limit signal at the anti-clipping voltage limit input, the power-based voltage limit signal at the power-based voltage limit input, and the current-based voltage limit signal at the current-based voltage limit input, and output the selected minimum signal as the audio voltage threshold signal.

7. An electronic circuit comprising:
a voltage limiting circuitry having a filtered audio input, an audio voltage threshold input, and a gain signal output;
a filter having an audio input and an audio output coupled to the filtered audio input; and
a selector having an anti-clipping voltage limit input, a power-based voltage limit input, a current-based voltage limit input, and an output coupled to the audio voltage threshold input, the selector configured to select one of an output of the anti-clipping voltage limit input, an output of the power-based voltage limit input and an output of the current-based voltage limit input, and output the selected output as an audio voltage threshold signal to the audio voltage threshold input of the voltage limiting circuitry, wherein the filter comprises a de-emphasis filter configured to compensate for a decoupling capacitor between a voltage source and external series resistance (ESR) between an output of a voltage source and a supply voltage input of an amplifier associated with the voltage limiting circuitry.

8. The electronic circuit of claim 7, wherein the de-emphasis filter is configured to compensate for capacitive ripple of a voltage at the supply voltage input of the amplifier.

9. The electronic circuit of claim 7, wherein the de-emphasis filter is configured to be tuned based on the decoupling capacitor.

10. An audio system comprising:
an amplifier having an audio input, a supply voltage input and a voltage output adapted to be coupled to a load; and
regulating circuitry configured to:
determine a present value of a source voltage and generate a measured voltage signal representing an estimated present value of the voltage source based on a maximum input voltage value of a voltage at the supply voltage input of the amplifier, an average input voltage value of the voltage at the supply voltage input of the amplifier and a silence voltage threshold,
set a present value of an estimate of external series resistance (ESR) between the voltage source and the supply voltage input of the amplifier, the present value of ESR based on a minimum input voltage value of the voltage at the supply voltage input of the amplifier, a previous value of the estimate of ESR and whether audio of the audio system is under compression,
determine an anti-clipping voltage limit signal based on the estimated present value of the voltage source, the present value of the ESR and a measured resistance value indicative of a present resistance of the load,
calculate a power-based voltage limit signal based on a first function of the estimated present value of the voltage source, and
calculate a current-based voltage limit signal based on a second function of the estimated present value of the voltage source.

11. The audio system of claim 10, wherein the regulating circuitry comprises:
a voltage limiter configured to receive a select one of the anti-clipping voltage limit signal, the power-based voltage limit signal, and the current-based voltage limit signal, as an audio voltage threshold signal.

12. The audio system of claim 11, wherein the regulating circuitry is configured to select a minimum of the anti-clipping voltage limit signal, the power-based voltage limit signal, and the current-based voltage limit signal, and output the selected minimum signal as the audio voltage threshold signal to the voltage limiter.

13. The audio system of claim 10, further comprising:
a de-emphasis filter having an input configured to receive an audio input signal and an output coupled to an audio input of a voltage limiter.

14. The audio system of claim 13, wherein the de-emphasis filter is configured to compensate for frequency-dependent ripple of the voltage at the supply voltage input of the amplifier.

15. The audio system of claim 10, further comprising:
load measurement circuitry configured to measure a resistance of the load and output a signal indicative of the present resistance of the load.

16. The audio system of claim 15, wherein the load measurement circuitry includes load voltage and load current sensors.

17. A method comprising:
measuring a source voltage applied to an audio system to generate a measured source voltage signal;
updating an estimate of external series resistance (ESR) between a voltage source and a supply voltage input of an amplifier of the audio system to generate an updated estimate of ESR;
measuring a resistance of a load of the audio system to generate a measured resistance;
generating an anti-clipping voltage limit signal based on the measured source voltage signal, the updated estimated ESR, and the measured resistance;
calculating a power-based voltage limit signal based on the measured source voltage signal;
calculating a current-based voltage limit signal based on the measured source voltage signal; and
selecting one of the anti-clipping voltage limit signal, the power-based voltage limit signal, and the current-based voltage limit signal as an audio voltage threshold signal for the audio system.

18. The method of claim 17, wherein the generating operation comprises generating the anti-clipping voltage limit signal such that, the anti-clipping voltage limit signal is less than or equal to a ratio of the measured source voltage signal to a sum of one plus the estimated ESR divided by the measured resistance.

19. The method of claim 17, wherein the updating comprises updating the estimated ESR to maintain the anti-clipping voltage limit signal to be less than or equal to a ratio of the measured source voltage signal to a sum of one plus the estimated ESR divided by the measured resistance.

20. The method of claim 17, wherein the power-based voltage limit signal is calculated as a first function of the measured source voltage signal, and the current-based voltage limit signal is calculated as a second function the measured source voltage signal.

21. The method of claim 17, wherein the audio voltage threshold signal is selected to be a minimum of the anti-clipping voltage limit signal, the power-based voltage limit signal and the current-based voltage limit signal.

* * * * *